US007764067B2

(12) United States Patent
Lindsey

(10) Patent No.: US 7,764,067 B2
(45) Date of Patent: Jul. 27, 2010

(54) HIGH VOLTAGE CABLE TESTING METHOD

(75) Inventor: Robert W. Lindsey, Washington, IL (US)

(73) Assignee: Caterpillar Inc, Peoria, IL (US)

(*) Notice: Subject to any disclaimer, the term of this patent is extended or adjusted under 35 U.S.C. 154(b) by 385 days.

(21) Appl. No.: 12/005,311

(22) Filed: Dec. 27, 2007

(65) Prior Publication Data

US 2009/0167315 A1  Jul. 2, 2009

(51) Int. Cl.
*G01R 31/08* (2006.01)
*H04B 3/46* (2006.01)

(52) U.S. Cl. .................... 324/519; 324/543; 324/509; 324/522

(58) Field of Classification Search .............. 324/519, 324/541, 539, 543, 544, 509
See application file for complete search history.

(56) References Cited

U.S. PATENT DOCUMENTS

| | | | |
|---|---|---|---|
| 3,612,992 A | 10/1971 | Cronin | |
| 3,763,399 A | 10/1973 | Jenkins | |
| 4,338,561 A | 7/1982 | Zaengl et al. | |
| 5,514,967 A | 5/1996 | Zelm | |
| 5,606,592 A * | 2/1997 | Galloway et al. | 379/30 |
| 5,621,600 A | 4/1997 | Iijima | |
| 5,848,365 A | 12/1998 | Coverdill | |
| 5,963,410 A | 10/1999 | Iijima | |
| 6,151,560 A | 11/2000 | Jones | |
| 6,252,409 B1 | 6/2001 | Iijima | |
| 6,392,854 B1 | 5/2002 | O'Gorman | |
| 6,856,137 B2 * | 2/2005 | Roden et al. | 324/509 |
| 6,885,920 B2 | 4/2005 | Yakes et al. | |
| 6,970,807 B2 | 11/2005 | Kito et al. | |
| 7,030,623 B1 | 4/2006 | Carpenter | |
| 7,049,825 B2 * | 5/2006 | Carruthers | 324/509 |
| 7,148,698 B2 | 12/2006 | Becker et al. | |
| 7,282,921 B2 | 10/2007 | Sela et al. | |
| 2004/0024502 A1 | 2/2004 | Squires et al. | |
| 2008/0129308 A1 | 6/2008 | Lindsey et al. | |
| 2008/0158756 A1 | 7/2008 | Lindsey et al. | |
| 2008/0285184 A1 * | 11/2008 | Phadke et al. | 361/1 |
| 2009/0001993 A1 | 1/2009 | Lindsey et al. | |
| 2009/0033357 A1 | 2/2009 | Lindsey et al. | |
| 2009/0085575 A1 | 4/2009 | Lindsey et al. | |
| 2009/0085759 A1 | 4/2009 | Lindsey et al. | |
| 2009/0140748 A1 | 6/2009 | Lindsey et al. | |

* cited by examiner

*Primary Examiner*—Timothy J Dole
*Assistant Examiner*—John Zhu
(74) *Attorney, Agent, or Firm*—Finnegan, Henderson, Farabow, Garrett & Dunner

(57) ABSTRACT

A method of testing a cabling system is disclosed. The method may include discharging an input filter capacitor associated with an accessory component, charging an accessory bus capacitor to a desired voltage level, and connecting the accessory bus capacitor to the input filter capacitor. The method may also include continuously monitoring a voltage waveform associated with the accessory bus capacitor. The method may further include determining a difference between the voltage waveform and a nominal voltage profile, and detecting a fault if the difference is greater than a threshold value.

20 Claims, 2 Drawing Sheets

HIGH VOLTAGE CABLE TESTING METHOD

TECHNICAL FIELD

This application relates to a cable testing method, and more particularly, to a high voltage cable testing method.

BACKGROUND

Electric or hybrid machines are widely used as alternatives to their mechanical counterparts in industrial applications due to their higher efficiency and lower maintenance requirements. A high voltage power supply system is required for driving these electric machines. In the high voltage system of an electric or hybrid machine, an electrical fault, such as an interconnection fault or a component fault, in a cabling system may cause damage to the machine.

For example, a high voltage cabling system usually includes one or more wire harnesses that enable communication of electrical power between the various systems of the electric machine. For example, wire harnesses may be electrical conductors and connectors. These wire harnesses may be configured to pass various types of electrical signals, including DC voltage potentials and AC voltage signals. The integrity of the high voltage cabling system is important to the reliability of the machine. For instance, arcs may occur at the connector, if the connector components are not fully engaged, properly soldered or crimped, or if other types of connector fault occur. Arcs usually contain high energy and generate a large amount of heat that may melt the connector and other conductive components.

In order to mitigate the potential damage caused by an electrical fault in the cabling system, it is important to detect the fault accurately and in an early stage. Conventionally, detecting such a fault requires disconnecting the electrical component and manually testing its continuity. However, this traditional approach may be costly and inefficient as the cabling system in the electric machine becomes more complex.

One method for testing faulty conditions on the high voltage wiring system may measure voltage values at several points close to a load. For example, U.S. Pat. No. 7,282,921 to Sela et al. ("the '921 patent") describes a method for monitoring local voltage levels and continuity measurements of electrical-power presence at one or more points in the electrical system of a facility. The method of the '921 patent includes measuring and tracking changes in the local voltage, comparing the measurements with profiles, and detecting changes and events that may be indicative of faults in the wiring. The method further includes continuity measurements regarding the presence of electrical power. The testing method described in the '921 patent uses sensing devices plugged-in between the power plugs of different pieces of electrical equipment and the sockets that supply power to these power plugs.

Although the electrical fault testing method described in the '921 patent may be effective for testing high voltage cables and detecting electrical faults, it may nonetheless be problematic. For example, the testing method described in the '921 patent relies on external sensing devices plugged in at the multiple measurement points, which may render the testing method inefficient and time-consuming. Furthermore, the testing method described in the '921 is performed while the electrical distribution system is in regular use, i.e., while high voltage is applied. Therefore, an electrical fault may cause damage to system components before it is detected and cleared. In addition, the solution provided by the '921 patent may not be reliable, as it lacks cross-validation. For example, the testing method described in the '921 patent relies on abnormal voltage drop as the only fault indicator, and thus the test result may be affected by other unreliable factors in the system.

The disclosed high voltage cable testing method is directed towards overcoming one or more of the shortcomings noted above.

SUMMARY

In one aspect, the present disclosure is directed to a method of testing a high voltage cabling system. The method may include discharging an input filter capacitor associated with an accessory component, charging an accessory bus capacitor to a desired voltage level, and connecting the accessory bus capacitor to the input filter capacitor. The method may also include continuously monitoring a voltage waveform associated with the accessory bus capacitor. The method may further include determining a difference between the voltage waveform and a nominal voltage profile, and detecting a fault if the difference is greater than a threshold value.

In another aspect, the present disclosure is directed toward high voltage cable testing system. The system may include an accessory bus capacitor, an input filter capacitor associated with an accessory component, and an accessory switch configured to connect and disconnect the input filter capacitor from the accessory bus capacitor. The system may also include a power source configured to charge the accessory bus capacitor to a desired voltage level. The system may further include a controller configured to perform a high voltage cable test using the accessory bus capacitor, the input filter capacitor, and the accessory switch.

DETAILED DESCRIPTION

Figure 1:
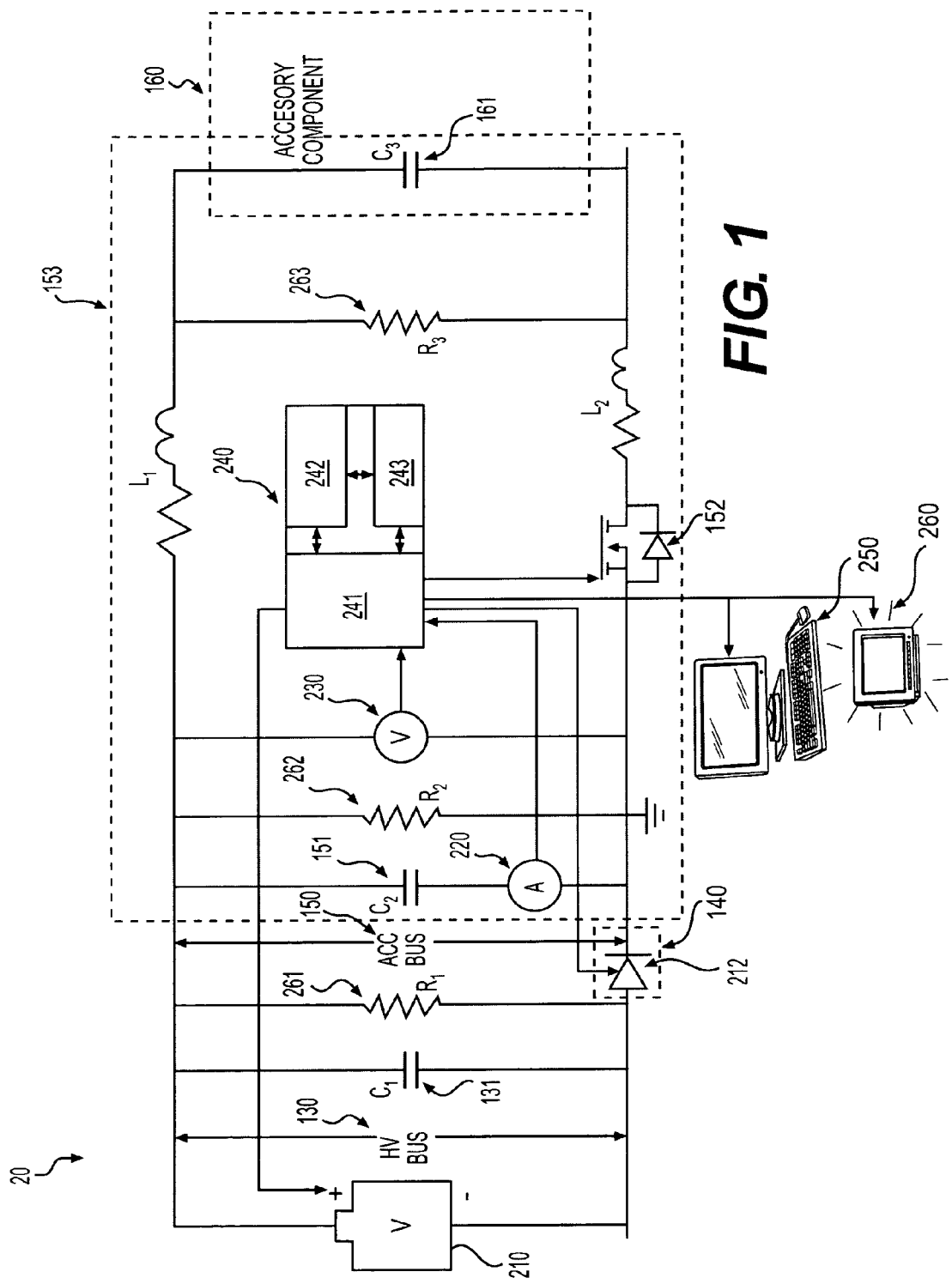
FIG. 1 provides a block diagram of a high voltage cable testing system consistent with an exemplary disclosed embodiment.

FIG. 1 provides a block diagram of a high voltage cable testing system 20 consistent with an exemplary disclosed embodiment. High voltage cable testing system 20 may include a power source 210, an accessory bus capacitor 151 electrically coupled to power source 210, a current sensor 220, and a voltage sensor 230, both coupled to accessory bus capacitor 151. High voltage cable testing system 20 may further include an input filter capacitor 161 associated with an accessory component 160, and an accessory switch 152 connecting accessory component 160 to accessory bus 150. High voltage cable testing system may also include a controller 240, a user input interface 250, and an indication device 260.

High voltage cable testing system 20 may be configured to test a cabling system 153. Cabling system 153 may couple the one or more accessory components 160 to an accessory bus 150. For example, accessory component 160 may be an electronic battery charger, an electric pump controller, an air conditioner, electric fan, or any other electrical load. Cabling system 153 may include one or more wire harnesses, or electrical connectors. An electrical connector may include a female component having one or more receptacles, and a male component having one or more terminals configured to engage the one or more receptacles. Additionally, an electrical connector may include a terminal bonded (such as soldered, brazed, welded, crimped, and etc) to one conductor and bolted to another conductor. In addition, cabling system 153 may also include at least one electrical conductor that transfers power from the power source to accessory components 160. The electrical harness may degrade during use. For example, the electrical harness may be pinched, or a connector may have disengaged or corroded terminals. If such electrical connector degradation is not detected and cleared in time, an arc may occur between the female component and male component in the electrical connector, and the arc may cause damage to accessory components 160 and other components associated with the power system of the machine.

High voltage cable testing system 20 may be an integral part of a power system of a machine and share the usage of existing components of the power system. For example, power source 210 may be associated with a power source of the machine, controller 240 may be part of a power control module of the power system, and both user input interface 250 and indication device 260 may be parts of a control panel of the machine. In addition, accessory capacitor 151, current sensor 220, voltage sensor 230, input filter capacitor 161, and accessory switch 152 may all be integral parts of the power system of the machine. Accordingly, high voltage cable testing system 20 may not require any external components, plug-ins or additional wirings. Therefore, the testing system may be simple and cost-effective.

High voltage cable test may be performed upon initialization. For example, a high voltage cable test may be initiated by a user generated test request via user input interface 250. Alternatively, a test may be initiated automatically by the ECM at a certain event of the machine, for example, a key-on event. For example, a user of high voltage cable testing system 20 may also specify an accessory component to be included in the test via user input interface 250 at the time of requesting a test.

Power source 210 may be electrically coupled to high voltage bus 130 to provide power to high voltage cable testing system before high voltage is applied on high voltage bus 130. Power source 210 may be a DC power source, such as a DC voltage source or a DC current source. Power source 210 may be part of the existing components of the machine, such as an AC-to-DC power converter, or DC-to-DC power converter. Alternatively, power source 210 may be an external device that supplies power, such as, for example, a battery or other suitable power supplies. For the purpose of high voltage cable testing, power source 210 may be a low-voltage power source that provides a low voltage, e.g., a voltage lower than 50 volts.

High voltage bus capacitor 131 and a high voltage bus bleeder resistor 261 may be coupled to power source 210 in parallel, to provide a discharge circuit. A power source switch 212 may also be included to connect and disconnect a high voltage bus 130 with accessory bus 150. Consistent with a disclosed embodiment, power source switch 212 may be a power electronic device of a DC-to-DC power converter 140. For example, power source switch 212 may be a IGBT switch of DC-to-DC power converter 140. Alternatively, power source switch 212 may be any other suitable electric switches known in the art.

Similar to high voltage bus capacitor 131 and high voltage bus bleeder resistor 261, accessory bus capacitor 151 and accessory bus bleeder resistor 262 may be electrically coupled to accessory bus 150 in parallel, to provide a discharge circuit. When power source 210 is turned on and power source switch 212 is closed, accessory bus capacitor 151 and high voltage bus capacitor 131 may be charged, and gradually reach a voltage level equal to that of power source 210. After power source 210 is turned off and power source switch 212 is opened, the voltage level associated with accessory bus capacitor 151 and high voltage bus capacitor 131 may gradually bleed down dependently. For example, accessory bus capacitor 151 may have a discharge time constant that is different than high voltage bus capacitor 131.

Current sensor 220 may be connected to accessory bus capacitor 151 in series to monitor a current flowing through the capacitor. Voltage sensor 230 may be connected to accessory bus capacitor 151 in parallel to monitor a voltage associated with the capacitor. Both current sensor 220 and voltage sensor 230 may be in communication with controller 240 to report the sensor measurements.

Input filter capacitor 161 may be included in accessory component 160 and utilized as part of its power conversion circuitry. Accessory switch 152 may connect and disconnect accessory bus 150 with input filter capacitor 161 of accessory component 160. Accessory switch 152 may be a power electronic device, such as, for example, an IGBT transistor. Alternatively, accessory switch 152 may be any other suitable electric switch known in the art. When accessory switch 152 is closed, the charges stored in accessory bus capacitor 151 may be partially transferred to input filter capacitor 161 via cabling system 153, so that input filter capacitor 161 may be charged to a certain voltage level. For example, if the voltage level associated with accessory bus capacitor 151 is $V_2$ before accessory switch 152 is closed, after the charge transfer reaches steady-state, the voltage level $V_3$ associated with input filter capacitor 161 may be:

$$V_3 = V_2 - V_2 \times C_3/(C_2 + C_3).$$

where $C_2$ and $C_3$ are the capacitances of accessory bus capacitor 151 and input filter capacitor 161, respectively.

Controller 240 may be electrically coupled to and communicate with power source 210, power source switch 212, current sensor 220, voltage sensor 230, accessory switch 152, user input interface 250, and indication device 260. Controller 240 may be configured to receive a high voltage cable test request and discharge accessory bus capacitor 151 and input filter capacitor 161 associated with an accessory component 160 specified by the test request. Controller 240 may be further configured to control power source 210 and power source switch 212 to charge accessory bus capacitor to a desired voltage level. Controller 240 may be configured to continuously communicate with current sensor 220 and voltage sensor 230 to monitor a current waveform and a voltage waveform, and compare the waveforms with their corresponding nominal profiles. Controller 240 may be further configured to determine that a fault exists in high power cabling system 153 if the difference between the measured waveforms and their nominal profiles is greater than a threshold. Controller 240 may be also configured to notify a user of the machine if a fault exists and list possibilities for effective repairs, via indication device 260.

Consistent with one disclosed embodiment, controller 240 may be coupled to user input interface 250 to receive the test request from a user. Alternatively, controller 240 may also be coupled to receive the test request from the machine control system at a certain event. Controller 240 may further be coupled to one or more indication devices 260 to indicate the fault and/or display the fault.

Controller 240 may include a communication unit 241, a storage unit 242, and a processing unit 243. Communication unit 241, storage unit 242, and processing unit 243 may be configured to communicate with each other. For example, communication unit 241, storage unit 242, and processing unit 243 may be physically connected by cables or other communication lines, or alternatively by a wireless network. According to one disclosed embodiment, communication unit 241, storage unit 242, and processing unit 243 may communicate with one another to transfer data and/or send and/or receive instructions.

Communication unit 241 may include an analog to digital converter (ADC), a data buffer, or a control signal generating device. Communication unit 241 may be coupled to current sensor 220 and voltage sensor 230, and configured to receive current and voltage measurements, sample the received voltage signal (if current sensor 220 and/or voltage sensor 230 are analog sensors) and store data in the data buffer. Communication unit 241 may be further coupled to power source 210 and configured to turn on and turn off the power source. Communication unit 241 may also be coupled to power source switch 212 and accessory switch 152, and configured to generate control signals to open or close the switches.

Communication unit 241 may be further coupled to the user input interface 250 and configured to receive a test request from a user. Communication unit 241 may send the test request to processing unit 243. The test request may include a list of accessory components to be included in the test and may include characteristic data of each accessory component 160, such as, for example, the capacitance of its input filter capacitor 161. The test request may further include other information such as when the test should be performed, how the user should be notified, and whether protection actions should be performed if a fault is detected. Communication unit 241 may be further coupled to indication device 260 and configured to send the fault notice generated by processor unit 243 to indication device 260.

Storage unit 242 may include a memory device such as, for example, a hard disk, a flash drive, a RAM or any other suitable type of storage medium, and be configured to store nominal current and voltage profiles for all accessory components 160, and a plurality of threshold values. The nominal profiles and threshold values may be determined in advance based on empirical knowledge or previous measurements, and programmed into storage unit 242. Alternatively, the nominal profiles may be saved into storage unit 242 periodically and adaptively during the test. For example, if high voltage cable testing system 20 determines that cabling system 153 is working properly, the voltage and current measurement acquired by current sensor 220 and voltage sensor 230 associated with accessory bus capacitor 151 may be adaptively saved as the nominal profiles for the particular accessory component 160.

The nominal voltage profile may consist of voltage intensities associated with accessory bus capacitor 151 before and after connecting the accessory bus capacitor to input filter capacitor 161. The nominal current profile may consist of a peak current intensity and a current pulse transition time associated with accessory bus capacitor 151 during the charge transfer. The nominal profiles may be stored in a look up table in storage unit 242 and each profile pair (current and voltage) may correspond to one accessory component 160.

Processing unit 243 may include a processing device and a data buffer. The processing device may be, for example, a CPU, a microprocessor, a digital signal processor (DSP), or any suitable processor. Processing unit 243 may be configured to receive a test request from communication unit 241, process the test request, and obtain the current and voltage waveforms associated with the requested accessory component 160 from communication unit 241. Processing unit 243 may also be configured to retrieve corresponding nominal profiles and threshold values from storage unit 242. For each accessory component 160, processing unit 243 may operate to determine a difference between the measured voltage/current waveform and its nominal profile, and detect a fault if the difference is greater than a threshold.

If the difference is determined to be below the threshold value, and thus cabling system 153 is working properly, processing unit 243 may be configured to send the measured current and voltage waveforms to storage unit 242 and adaptively update the nominal profiles stored for the corresponding accessory component 160.

User input interface 250 may be a computer, an operator console, or a handheld operator panel. User input interface 250 may be coupled to controller 240 via communication cables, wireless networks, or other communication mediums. User input interface 250 may include graphic interface for user input and a processor for generating a test request and may include a keyboard, a mouse and/or a touch screen. User input interface 250 may be configured to generate a test request based on the user inputs, and configured to send the test request to communication unit 241. It is contemplated that a user may modify the threshold values and nominal profiles via user input interface 250.

Indication device 260 may be operatively coupled to controller 240, and configured to provide one or more warning signals indicative of a fault associated with cabling system 153 to a user of the machine. For instance, indication device 260 may include any component configured to provide a warning signal to a user associated with the machine such as, for example, a visual device (e.g., warning lamp, LCD display, LED lamp, etc.); an audible device (e.g., speaker, bell, chime, etc.); a wireless device (e.g., cell phone, pager, etc.); or any other type of output device. In one embodiment, an LED lamp may be coupled with an audible alarm to provide a combination audio/visual warning. In another embodiment, the warning signal may trigger an event recorder to store the current and/or voltage waveforms to a memory device for later review.

Indication device 260 may include a display component, for example, a computer, an operator panel, or an LCD for displaying the fault. The indication device 260 may include a screen that displays the fault on the screen. Consistent with an exemplary embodiment, the fault notice may be displayed as a text file. Consistent with another exemplary embodiment, the fault notice may also be displayed as a diagrammatic chart including a configuration of the high voltage power system, graphic views of individual accessory component, and cable fault locations marked in a notable manner.

INDUSTRIAL APPLICABILITY

Although the disclosed embodiments are described in association with a high voltage cable testing system for a machine, the disclosed cable testing method may be used in any environment where it may be desirable to provide a fault indication using charge transferring among integrated capacitors. A method of operating high voltage testing system 20 is explained below. The disclosed cable testing method may include discharging an input filter capacitor associated with an accessory component, charging an accessory bus capacitor to a desired voltage level, and connecting the accessory bus capacitor to the input filter capacitor. The method may also include continuously monitoring a voltage waveform associated with the accessory bus capacitor, comparing and determining a difference between the voltage waveform and a nominal voltage profile, and detecting a fault if the difference is greater than a threshold. Moreover, the disclosed cable testing method may further include determining the nominal profiles based on characteristics of the cabling system and accessory components, and adaptively updating the nominal profiles with the measured current and voltage waveforms that are determined normal.

Figure 2:
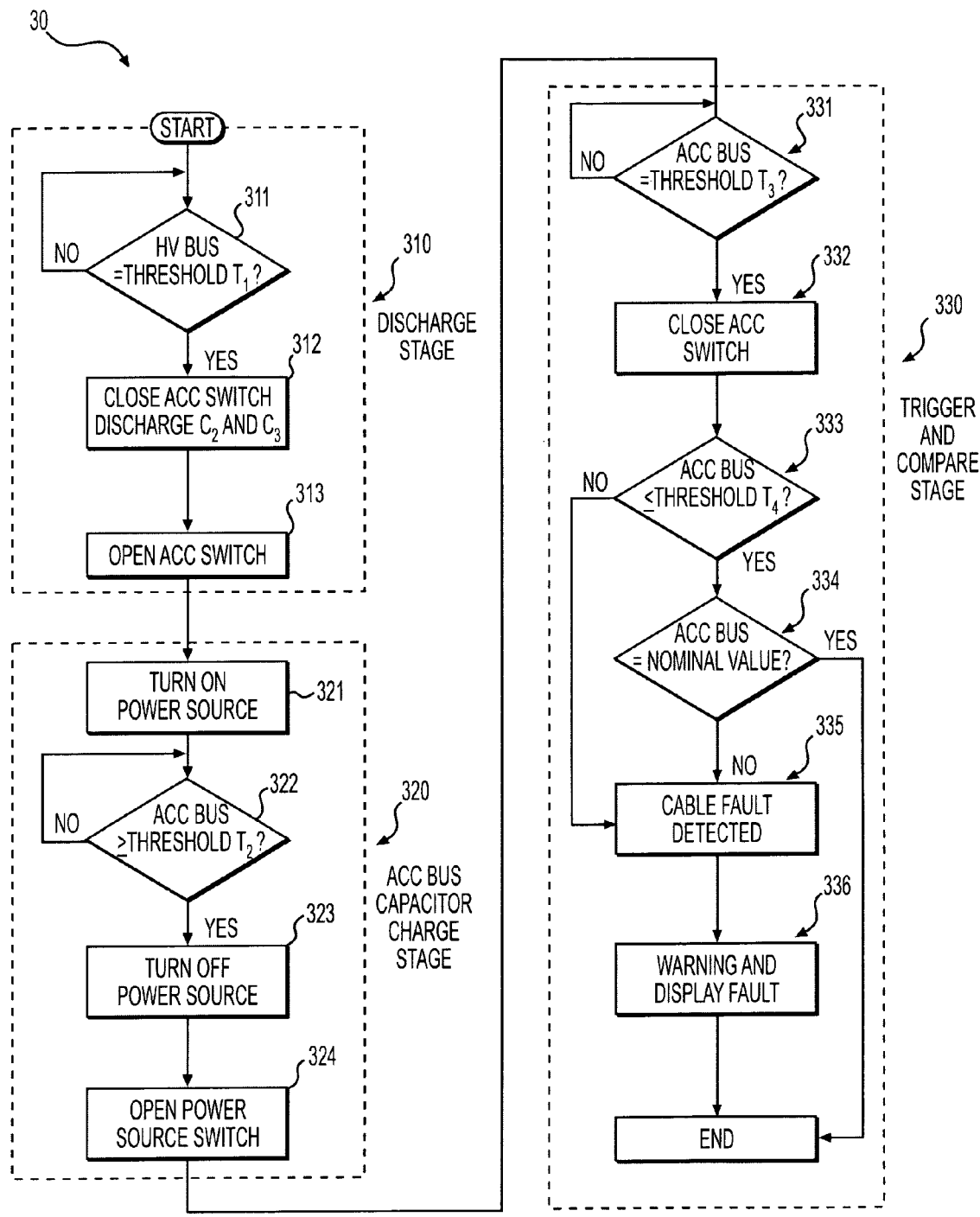
FIG. 2 provides a flowchart of an exemplary operation process for testing the high voltage cabling system and indicating a fault, consistent with the disclosed embodiment shown in FIG. 1.

FIG. 2 shows a flowchart of an exemplary operation process 30 for testing the high voltage cabling system and indicating a fault, consistent with the disclosed embodiment shown in FIG. 1. As shown in FIG. 2, process 30 may include a discharge stage 310, an accessory bus capacitor charge stage 320 and a trigger and compare stage 330. Discharge stage 310 may wait for the voltage level of high voltage bus 130 to bleed down and continuously check until the voltage level is equal to a threshold value $T_1$ (Step 311). When $T_1$ is reached (Step 311: Yes), discharge stage 310 may close accessory switch 152 to discharge accessory bus capacitor 151 and input filter capacitor 161 (Step 312). Discharge stage 310 may then open accessory switch 152 in preparation for the next stage. The discharge stage may assure that capacitors C1, C2 and C3 are significantly discharged.

Accessory bus capacitor charge stage 320 may turn on power source 210 and close power source switch 212 to charge accessory bus capacitor 151 (Step 321). During the charging process, accessory bus capacitor charge stage 320 may continuously check whether the voltage level of accessory bus 150 is higher than a threshold value $T_2$ (Step 322). When $T_2$ is exceeded (Step 322: Yes), accessory bus capacitor charge stage 320 may turn off power source 210 (Step 323) and may open power source switch 212 (Step 324) to complete the charging process.

Trigger and compare stage 330 may wait for the voltage level of accessory bus 150 to bleed down and continuously check until the voltage level is equal to a threshold value $T_3$ (Step 331). When $T_3$ is reached (Step 331: Yes), trigger and compare stage 330 may close accessory switch 152 to connect accessory bus capacitor 151 and input filter capacitor 161 (Step 332). Trigger and compare stage 330 may continuously monitor the voltage level of accessory bus 150, and determine whether it drops below threshold value $T_4$ due to the capacitor charge transfer (Step 333). If the voltage level does not drop below $T_4$ (Step 333: No) even after steady-state is reached, an open cable fault is detected (Step 335) and trigger and compare stage 330 may prompt to provide a warning and display the fault (Step 336).

If the voltage level of accessory bus 150 drops below $T_4$ (Step 333: Yes), its steady-state value after the charge transfer is complete may be compared to the nominal voltage profile (Step 334). If the steady-state accessory bus voltage is equal to the nominal voltage value (Step 334: Yes), no fault is detected in cabling system 153 and the test process 30 is complete. If the steady-state accessory bus voltage is not equal to the nominal voltage value (Step 334: No), a fault is detected in cabling system 153 (Step 335). Trigger and compare stage 330 may provide a warning and display the fault (Step 36). Additionally, trigger and compare stage 330 may also provide suggestions for effective repairs to the user of the machine, in Step 336. For example, based on the location and nature of the fault, controller 240 may obtain from its storage unit 242 a list of suggested repair procedures that may be used to clear the fault. The suggested repair procedures may be displayed on indication device 260.

Additionally, or alternatively, a difference between the steady-state voltage value and the nominal value may be determined in Step 334, and the difference, instead of the voltage value, may be compared to a threshold value. If the difference is smaller than the threshold value (Step 334: Yes), no fault is detected, and if the difference is greater than the threshold (Step 334: No), a fault is detected in cabling system 153 (Step 335).

High voltage cable testing method disclosed in the present application may be more efficient than conventional approaches. The testing method may be automated such that specialized training and tools are not required. The method may test the cable and detect its electrical fault in-situ using features within the high voltage system of the machine. For example, high voltage cable testing system 20 may be an integral part of the machine and share the usage of existing components. Furthermore, the high voltage cable testing method disclosed in the present application may be performed when the high voltage is not present and the test may use only low voltage power source 210. Therefore, the test may not result in components damage even if a fault exists. Faults may be detected and cleared before high voltage is applied. In addition, the high voltage cable testing method disclosed may provide improved accuracy and reliability. For example, the disclosed method may monitor both current and voltage waveforms, instead of one voltage intensity. Therefore, the method may use the multiple measurements available to cross-validate the detection, and provide a more accurate and more reliable test result. Additionally, testing the high voltage system with a low voltage may provide a less hazardous condition if a high voltage wiring system fault exists.

It will be apparent to those skilled in the art that various modifications and variations can be made to the disclosed high voltage cable testing method without departing from the scope of the disclosure. Other embodiments of the present disclosure will be apparent to those skilled in the art from consideration of the specification and practice of the disclosed embodiments. It is intended that the specification and examples be considered as exemplary only, with a true scope of the present disclosure being indicated by the following claims.

What is claimed is:

1. A method of testing a cabling system, comprising:
discharging an input filter capacitor associated with an accessory component;
charging an accessory bus capacitor to a desired voltage level;
connecting the accessory bus capacitor to the input filter capacitor in parallel using a switch;
continuously monitoring a voltage waveform associated with the accessory bus capacitor;
determining a difference between the voltage waveform and a nominal voltage profile; and
determining a fault if the difference is greater than a threshold value.

2. The method of claim 1, further including discharging the accessory bus capacitor before charging it to the desired voltage level.

3. The method of claim 1, further including determining the nominal voltage profile based on at least the desired voltage level and capacitances of the input filter capacitor and the accessory bus capacitor.

4. The method of claim 1, further including updating a stored nominal voltage profile with characteristic parameters associated with the measured voltage waveform.

5. The method of claim 1, further including:
continuously monitoring a current waveform associated with the accessory bus capacitor;
determining a difference between the current waveform and a nominal current profile; and detecting a fault if the difference is greater than a threshold-value.

6. The method of claim 5, further including determining the nominal current profile based on at least the desired voltage level and capacitances of the input filter capacitor and the accessory bus capacitor.

7. The method of claim 5, further including updating the nominal current profile with characteristic parameters associated with the measured current waveform.

8. The method of claim 1, further including:
providing a warning signal;
displaying a test report on a display device; and
listing possibilities for repairs.

9. The method of claim 1, wherein charging the accessory bus capacitor includes:
connecting the accessory bus capacitor to a power source;
charging the accessory bus capacitor with the power source until the accessory bus capacitor reaches the desired voltage level; and
disconnecting the accessory bus from the power source.

10. The method of claim 1, wherein the desired voltage level is lower than 50 volts.

11. The method of claim 1, wherein the nominal voltage profile consists of voltage intensities associated with the accessory bus capacitor before and after connecting the accessory bus capacitor to the input filter capacitor.

12. The method of claim 5, wherein the nominal current profile consists of a peak current intensity and a current pulse transition time associated with the accessory bus capacitor.

13. A high voltage cable testing system, comprising:
an accessory bus capacitor;
an input filter capacitor associated with an accessory component,;
an accessory switch connecting the input filter capacitor to the accessory bus capacitor, in parallel, and configured to connect and disconnect the input filter capacitor from the accessory bus capacitor;
a power source connected to the accessory bus capacitor and configured to charge the accessory bus capacitor to a desired voltage level; and
a controller connected to the high voltage cable testing system and configured to perform a high voltage cable test using the accessory bus capacitor, the input filter capacitor, and the accessory switch.

14. The high voltage cable testing system of claim 13, further includes a voltage sensor coupled to the accessory bus capacitor, configured to:
measure a voltage waveform; and
send the voltage waveform to the controller.

15. The high voltage cable testing system of claim 13, further includes a current sensor coupled to the accessory bus capacitor, configured to:
measure a current waveform; and
send the current waveform to the controller.

16. The high voltage cable testing system of claim 13, further includes a display device configured to indicate a fault if the fault is detected.

17. The high voltage cable testing system of claim 13, wherein the controller includes:
a storage unit configured to store a nominal voltage profile and a nominal current profile;
a communication unit, configured to close the accessory switch to discharge the input filter capacitor, control the power source to charge the accessory bus capacitor to a desired voltage level, connect the accessory bus capacitor to the input filter capacitor, and monitor a voltage waveform and a current waveform associated with the accessory bus capacitor; and
a processing unit, configured to compare and determine a difference between the voltage waveform and a nominal voltage profile, and determine a fault if the difference is greater than a threshold.

18. The high voltage cable testing system of claim 13, further includes a high voltage bus capacitor and a high voltage bus switch.

19. A method of testing a cabling system, comprising:
discharging an input filter capacitor associated with an accessory component;
discharging an accessory bus capacitor;
charging the accessory bus capacitor to a desired voltage level;
connecting the accessory bus capacitor to the input filter capacitor in parallel using a switch;
continuously monitoring a voltage intensity associated with the accessory bus capacitor;
determining an open fault if the voltage intensity is not below a threshold value, after steady-state is reached;
comparing the voltage intensity, after steady-state is reached, with a nominal voltage value; and
determining a fault if the voltage intensity is not equal to the nominal voltage value.

20. The method of claim 19, further including:
providing a warning signal;
displaying a test report on a display device; and
listing possibilities for repairs.

* * * * *